(12) United States Patent
Arao et al.

(10) Patent No.: US 6,774,397 B2
(45) Date of Patent: Aug. 10, 2004

(54) SEMICONDUCTOR DEVICE

(75) Inventors: Tatsuya Arao, Kanagawa (JP);
Hideomi Suzawa, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 09/826,416

(22) Filed: Apr. 5, 2001

(65) Prior Publication Data

US 2002/0020875 A1 Feb. 21, 2002

(30) Foreign Application Priority Data

May 12, 2000 (JP) ........................................ 2000-140592

(51) Int. Cl.[7] .................. H01L 29/04; H01L 31/036; H01L 31/0376; H01L 31/20
(52) U.S. Cl. .............................. 257/59; 257/61; 257/66; 257/72; 257/347
(58) Field of Search .......................... 257/59, 61, 66, 257/72, 347

(56) References Cited

U.S. PATENT DOCUMENTS

| | | | | |
|---|---|---|---|---|
| 5,528,082 A | * | 6/1996 | Ho et al. | 257/775 |
| 5,917,564 A | * | 6/1999 | Kim et al. | 27/59 |
| 6,008,869 A | * | 12/1999 | Oana et al. | 349/43 |
| 6,100,954 A | * | 8/2000 | Kim et al. | 257/410 |
| 6,140,158 A | | 10/2000 | Rhee et al. | |
| 6,222,600 B1 | * | 4/2001 | Hirano | 349/113 |
| 6,285,041 B1 | * | 9/2001 | Noguchi | 257/350 |

FOREIGN PATENT DOCUMENTS

JP  10-189977  7/1998

* cited by examiner

*Primary Examiner*—Thien F Tran
(74) *Attorney, Agent, or Firm*—Eric J. Robinson; Robinson Intellectual Property Law Office, P.C.

(57) ABSTRACT

To realize the reduction of a manufacturing cost and the enhancement of yield by reducing the number of steps of a TFT in an electro-optical device typified by an active matrix liquid crystal display device. A semiconductor device of the present invention is characterized by including a first wiring and a second wiring formed of a first conductive film on the same insulating surface, a first semiconductor film of one conductivity type formed on the first and second wirings so as to correspond thereto, a second semiconductor film formed on an upper layer of the first semiconductor film of one conductivity type across the first wiring and the second wiring, an insulating film formed on the second semiconductor film, and a third conductive film formed on the insulating film.

23 Claims, 9 Drawing Sheets

SEMICONDUCTOR DEVICE

TECHNICAL FIELD TO WHICH THE INVENTION BELONGS

The present invention relates to a semiconductor device manufactured by using a thin film transistor (hereinafter, referred to as a TFT), utilizing a semiconductor film, and a method of manufacturing the same. In particular, the present invention provides a technique that is preferably applicable to an electro-optical device typified by a liquid crystal display device and an electronic device equipped with such an electro-optical device. In this specification, a semiconductor device generally refers to devices that function by utilizing semiconductor characteristics, and also includes the above-mentioned electro-optical device and electronic device equipped with the same.

PRIOR ART

A liquid crystal display device is utilized for displaying an image and character information in a notebook personal computer (notebook computer) and a portable information terminal. Compared with a passive liquid crystal display device, an active matrix liquid crystal display device allows a high-precision image to be obtained, so that the latter is being preferably used for this purpose. In the active matrix liquid crystal display device, TFTs that are active elements are arranged in a matrix so as to correspond to respective pixels in a pixel portion. As a TFT, an n-channel TFT is typically used, and the TFT functions as a switching element to control a voltage applied to liquid crystal on a pixel basis, thereby conducting a desired display of an image.

According to a technique of manufacturing a TFT with an amorphous semiconductor typified by amorphous silicon, the TFT can be formed on a substrate with a large area at a low temperature of 300° C. or lower, so that the amorphous semiconductor is considered as a material suitable for mass-production. However, the TFT in which an active layer is formed of amorphous silicon has a small field-effect mobility, i.e., a value of 1 $cm^2$/Vsec or more cannot be obtained. Therefore, such a TFT is utilized specifically for a switching element provided in a pixel portion.

Such an active matrix liquid crystal display device is used in a wide range of applications such as a liquid crystal TV receiver as well as a portable information terminal and a notebook computer, and in order to achieve an increased area size of a screen and enhancement of an image quality, there is an increased demand for high precision and a high opening ratio.

The active matrix liquid crystal display device is manufactured by using a plurality of photomasks in a light exposure process, so as to dispose a gate wiring, a data wiring, a pixel electrode, and the like with good precision in a stacked manner. However, in order to enhance productivity and yield, minimizing the number of photomasks to reduce the number of steps is considered as effective means.

A photomask is used for forming a photoresist pattern to be a mask in an etching step on a substrate in a photolithography technique. When one photomask is used, the steps of coating a resist, pre-baking, light exposure, development, post-baking, and the like, and the steps of forming a coating and etching before and after the steps, and the steps of peeling off a resist, washing, drying and the like are added, which complicates a manufacturing process.

SUMMARY OF THE INVENTION

The present invention has been made in view of the above-mentioned background, and an object thereof is to realize the reduction of a manufacturing cost and enhancement of yield by reducing the number of steps of a TFT in an electro-optical device typified by an active matrix liquid crystal display device.

In order to solve the above-mentioned problem, according to the present invention, a TFT is manufactured by using two photomasks. More specifically, a TFT can be formed by using two photomasks: a first photomask for forming a data wiring and a pixel electrode, and a second photomask for forming a gate electrode. A resist pattern formed by using the second photomask is also applied to etching processing of an n-type first semiconductor film, a second semiconductor film for forming a channel, and barrier metal, other than as a gate electrode.

A semiconductor device of the present invention includes: a first wiring and a second wiring formed of a first conductive film on an insulating surface; a first semiconductor film of one conductivity type formed on the first and second wirings so as to correspond thereto; a second semiconductor film formed on upper layer of the first semiconductor film of one conductivity type across the first wiring and the second wiring; an insulating film formed on the second semiconductor film; and a third conductive film formed on the insulating film.

Further, another structure of a semiconductor device of the present invention includes: a first wiring and a second wiring formed of a first conductive film on an insulating surface; a second conductive film formed on the first and second wirings so as to correspond thereto; a first semiconductor film of one conductivity type formed on the second conductive film; a second semiconductor film formed on an upper layer of the first semiconductor film of one conductivity type across the first wiring and the second wiring; an insulating film formed on the second semiconductor film; and a third conductive film formed on the insulating film, characterized in that an end portion of the second semiconductor film is provided inside an end portion of the second conductive film.

Furthermore, another structure of a semiconductor device of the present invention includes: a data wiring and a pixel electrode formed on an insulating surface; a first semiconductor film of one conductivity type formed so as to correspond to the data wiring and the pixel electrode; a second semiconductor film formed on an upper layer of the first semiconductor film of one conductivity type across the data wiring and the pixel electrode; a gate insulating film formed on the second semiconductor film; and a gate electrode formed on the gate insulating film.

Moreover, another structure of a semiconductor device of the present invention includes: a data wiring and a pixel electrode formed on an insulating surface; barrier metal formed so as to correspond to the data wiring and the pixel electrode; a first semiconductor film of one conductivity type formed on the barrier metal; a second semiconductor film formed on an upper layer of the first semiconductor film of one conductivity type across the data wiring and the pixel electrode; a gate insulating film formed on the second semiconductor film; and a gate electrode formed on the gate insulating film, characterized in that an end portion of the second semiconductor film is provided inside an end portion of the barrier metal.

A method of manufacturing a semiconductor device of the present invention by using two photomasks includes the steps of: forming a first mask by first light exposure, using a first photomask; etching a first semiconductor film of one conductivity type, a second conductive film, and a first conductive film by first etching processing, using the first mask; forming a second mask by second light exposure, using a second photomask; etching a third conductive film by second etching processing, using the second mask; and etching an insulating film, a second semiconductor film, the first semiconductor film, and the second conductive film by third etching processing after the second etching processing.

Furthermore, another structure of a method of manufacturing a semiconductor device of the present invention includes the steps of: forming a first conductive film on an insulating surface; forming a second conductive film on the first conductive film; forming a first semiconductor film of one conductivity type on the second conductive film; forming a first mask by first light exposure using a first photomask; first etching of etching the first semiconductor film of one conductivity type, the second conductive film, and the first conductive film by first etching processing, using the first mask; forming a second semiconductor film after the first etching step; forming an insulating film on the second semiconductor film; forming a third conductive film on the insulating film; forming a second mask by second light exposure using a second photomask; second etching of etching the third conductive film by second etching processing, using the second mask; and third etching of etching the insulating film, the second semiconductor film, the first semiconductor film, and the second conductive film by third etching processing after the second etching step.

According to the present invention, a TFT can be formed by using two photomasks, and an electro-optical device typified by an active matrix liquid crystal display device can be manufactured by using the TFT.

EMBODIMENT MODE OF THE INVENTION

Hereinafter, embodiments of the present invention will be described with reference to the accompanying drawings.

Figure 1:
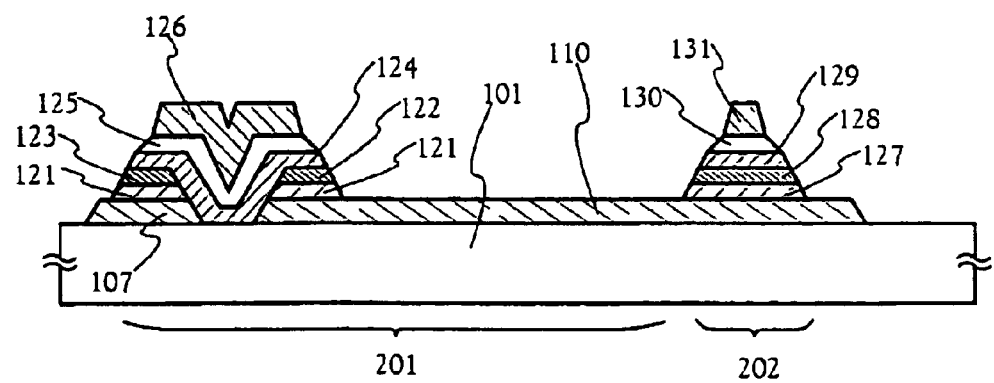
FIG. 1 A cross-sectional view of a TFT of the present invention.

FIG. 1 is a cross-sectional view of a TFT manufactured by using two photomasks, showing a structure for use as an n-channel TFT of a liquid crystal display device. A TFT is formed on a substrate 101 having an insulating surface. A data wiring 107 and a pixel electrode 110 are formed of a conductive material containing aluminum (Al) as its main constituent on the same surface. Reference numeral 121 indicates barrier metal made of titanium (Ti), tantalum (Ta), titanium nitride (TiN), tantalum nitride (TaN), or the like, which prevents the conductive material containing Al as its main constituent forming the data wiring 107 and the pixel electrode 110 from being reacted with a semiconductor film to form an alloy.

N-type first semiconductor films 122 and 123 with a thickness of 50 to 100 nm form a source region or a drain region, and a second semiconductor film 124 for forming a channel is formed across the first semiconductor films 122 and 123. The semiconductor film 124 is formed to a thickness of 50 to 250 nm. The n-type first semiconductor films 122 and 123, and the second semiconductor film 124 are made of amorphous silicon or microcrystalline silicon. An insulating film 125 made of silicon oxide or silicon nitride is formed on the semiconductor film 124 to a thickness of 100 to 200 nm, and is used as a gate insulating film. Furthermore, a gate electrode 126 is provided on the insulating film 125. The gate electrode is preferably made of tungsten (W). These components are integrated to form a pixel TFT 210. The structure of the TFT shown in FIG. 1 is called a forward stagger type.

A storage capacitor 220 is formed on a part of the pixel electrode 110. More specifically, barrier metal 127, an n-type first semiconductor film 128, a second semiconductor film 129, an insulating film 130, and a capacitor wiring 131 are laminated on the pixel electrode 110. The storage capacitor 202 is formed so that the pixel electrode functions as one electrode, and the capacitor wiring 131 functions as the other electrode (see FIG. 2).

The TFT structure shown in FIG. 1 can be manufactured by using two photomasks: a first photomask for forming a data wiring and a pixel electrode and a second photomask for forming a gate electrode. A resist pattern formed by the second photomask is also applied to etching processing of the n-type first semiconductor film, the semiconductor film for forming a channel, and the barrier metal, as well as the gate electrode. A passivation film may be formed on the gate electrode. However, in this case, one more photomask is added for exposing the pixel electrode and the terminal portion.

By forming the pixel electrode, using the conductive material containing aluminum as its main constituent, a reflection type liquid crystal display device can be manufactured. On the other hand, if the pixel electrode is made of a transparent conductive material using indium oxide, tin oxide, zinc oxide, or the like, a transmission type liquid crystal display device can be manufactured. In any case, only two photomasks are required, so that the number of steps can be substantially reduced. However, in order to obtain the TFT structure of the present invention show in FIG. 1, selective etching should be conducted between the material forming the pixel electrode and the semiconductor film or insulating film material formed on the pixel electrode. The combination of the above-mentioned materials allows selective etching processing to be conducted, and the entire etching processing to be conducted by dry etching.

Embodiment 1

Figure 3A:
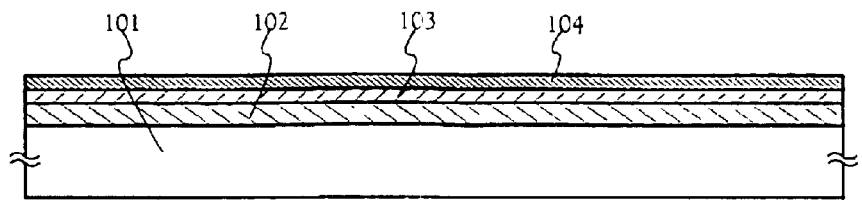
FIGS. 3A–3E Cross-sectional views illustrating a manufacturing process of a TFT of Embodiment 1.

A manufacturing process of the TFT shown in FIG. 1 will be described. In FIG. 3A, as a substrate 101, a glass substrate made of barium borosilicate glass, aluminoborosilicate glass, or the like, typified by #7059 glass and #1737 glass produced by Corning Inc. can be used. Alternatively, a stainless substrate, a ceramic substrate, or the like, on which a silicon oxide film, a silicon nitride film, or the like, is formed can also be used. An organic resin substrate made of polyethersulfone (PES), polyethylene terephthalate (PET), polyethylene naphthalate (PEN), or the like can also be used.

On the substrate 101, a first conductive film 102 made of Al containing 0.1 to 2% by weight of Ti and a second conductive film 103 made of Ti are formed to a thickness of 300 nm and 100 nm, respectively, by a sputtering method. The second conductive film 103 is provided as barrier metal. An n-type first semiconductor film 104 is formed to a thickness of 80 nm, using an amorphous silicon film by a sputtering method or a plasma CVD method. The n-type first semiconductor film 104 may be replaced by a microcrystalline silicon film. The n-type first semiconductor film 104 contains 0.5 to 1% by atom of phosphorus as an n-type impurity (donor), and has an electric conductivity of $1 \times 10^{-4}$ to $1 \times 10^{1}$ S/cm. The first conductive film may be formed of Al containing Sc, Si, Cu, and Nd in addition to Ti.

Figure 3B:
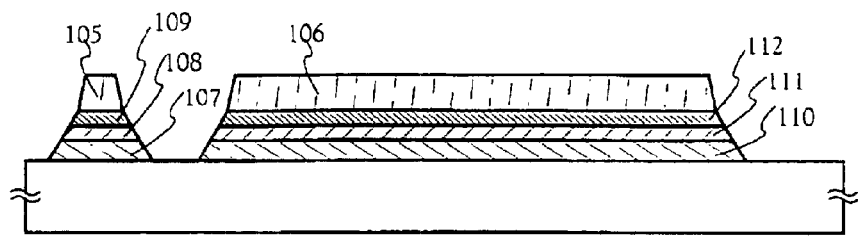
Figure 3C:
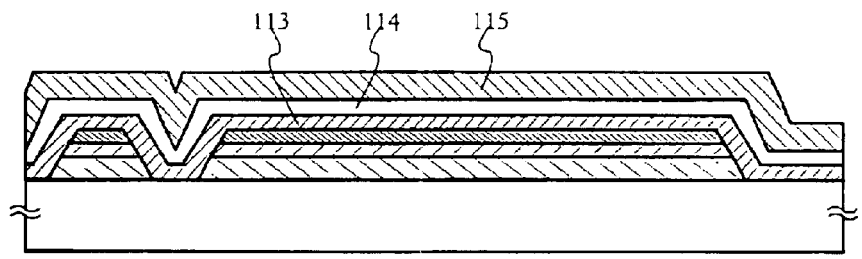

Next, first etching processing shown in FIG. 3B is conducted. According to this processing, masks 105 and 106 of a resist are formed by using a first photomask in a first light exposure process, and the n-type first semiconductor film 104, the second conductive film 103, and the first conductive film 102 are etched.

The light exposure process refers to a process in which a substrate is coated with a resist, and the resist is exposed to light through a photomask and developed by being soaked in a developer. The resist needs a plurality of times of baking processing at about 80 to 160° C. after coating the substrate, and development thereof requires processing in a developer and processing such as washing with water and drying.

Using mixed gas of $CF_4$ and $O_2$ for the n-type first semiconductor film, and $Cl_2$ or $BCl_3$ for the above-mentioned first and second conductive films as etching gases, reactive ion etching is conducted. At this time, etching is conducted so that a taper portion is formed at an end portion at an angle of 5° to 45°. Thus, a pattern of a data wiring constituted of the first conductive film 107, barrier metal 108, and an n-type first semiconductor film 109, and a pattern of a pixel electrode constituted of a first conductive film 110, barrier metal 111, and an n-type first semiconductor film 112 are formed. Thereafter, the masks 105 and 106 are removed.

Figure 4A:
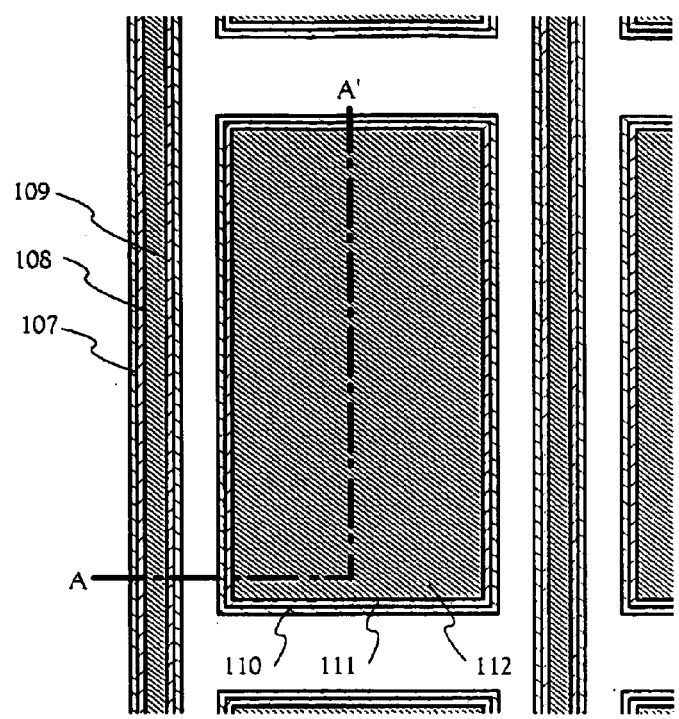
FIGS. 4A–4B Top views illustrating the manufacturing process of a TFT of Embodiment 1.

FIG. 4A is a top view of the above-mentioned state, and a line A–A' shown in this figure corresponds to a cross-sectional view shown in FIG. 3B.

On the above-mentioned layered structure, a second semiconductor film 113, an insulating film 114, and a third conductive film 115 are successively formed. The second semiconductor film 113 is obtained by forming a semiconductor film with an amorphous structure to a thickness of 50 to 200 nm (preferably 100 to 150 nm) by a method such as a plasma CVD method or a sputtering method. Typically, hydrogenated amorphous silicon (a-Si:H) film made of $SiH_4$ is formed to a thickness of 150 nm by a plasma CVD method. Alternatively, a compound semiconductor film with an amorphous structure such as a microcrystalline semiconductor film or an amorphous silicon germanium film can also be applied. The second semiconductor film 113 has an electric conductivity of $1 \times 10^{-6}$ S/cm or less, and is formed without intentionally adding an impurity known as a donor or an acceptor.

The insulating film 114 is formed to a thickness of 100 to 200 nm by using a plasma CVD method or a sputtering method. The preferable material is silicon nitride made of $SiH_4$, $NH_3$, and $N_2$ which is formed to a thickness of 150 nm by a plasma CVD method. Alternatively, the insulating film 114 may be formed of another insulating film such as a silicon oxide film, a silicon nitride oxide film, or a tantalum oxide film. For example, in the case of using a silicon oxide film, the insulating film 114 is formed by using tetraethyl orthosilicate (TEOS) and $O_2$ by a plasma CVD method.

The third conductive film 115 is formed to a thickness of 200 to 400 nm, using an element selected from the group consisting of Ta, Ti, and W, an alloy containing the element, or an alloy film containing a combination of the elements. For example, in the case where W is formed as a gate electrode and a gate wiring, W is formed to a thickness of 300 nm by introducing Ar gas, using W as a target by a sputtering method. In order to use W as the third conductive film 115, it is required to lower the resistivity of W. Its resistivity is desirably 20 $\mu\Omega$ cm or less. By enlarging crystal grains of the W film, the resistivity thereof can be decreased. However, in the case where a number of impurity elements such as oxygen are contained in W, crystallization is inhibited, and the resistivity of W is increased. Thus, in the case of a sputtering method, the W film is formed by using a W target with a purity of 99.9999% while care is sufficiently taken so that an impurity will not be mixed from a vapor phase during formation of the film. In particular, 30 ppm or less of an oxygen concentration was satisfactory. For example, by prescribing an oxygen concentration to be 30 ppm or less, the specific resistance of W of 20 $\mu\Omega$ cm or less can be realized.

Figure 3D:
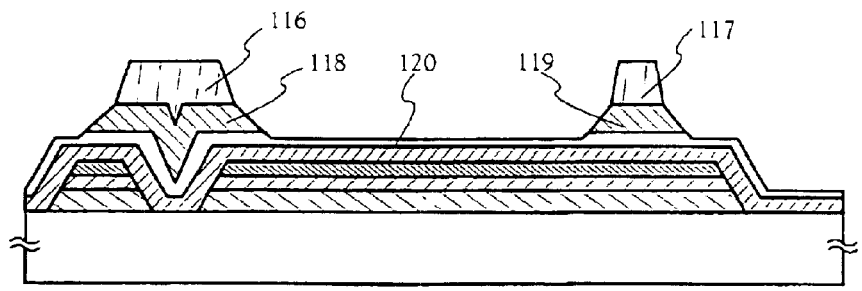

Then, second etching processing shown in FIG. 3D is conducted. First, masks 116 and 117 of a resist are formed by using a second photomask in a second light exposure process. The third conductive film 115 is etched so that a taper portion at an angle of 15° to 45° is formed at an end portion. This is conducted by subjecting W that forms the third conductive film 115 to reactive ion etching using mixed gas of $CF_4$, $Cl_2$, and $O_2$. Alternatively, in order to etch a hard material such as W at high speed with good precision and taper the end portion thereof, a dry etching method using high-density plasma is suitable. For a procedure of obtaining high-density plasma, an etching device using a micro-wave and inductively coupled plasma (ICP) is preferable. In particular, the ICP etching device can control plasma easily, and is also applicable to an increased area of a processing substrate.

Thus, a pattern 118 of a gate wiring and a pattern 119 of a capacitor wiring are formed as shown in FIG. 3D. Etching for forming an end portion into a taper shape is conducted by etching the masks of a resist while allowing an end portion thereof to roll backward. Therefore, during this etching step, the surface of an underlying insulating film 120 is also etched by about 5 to 50 nm.

Figure 3E:
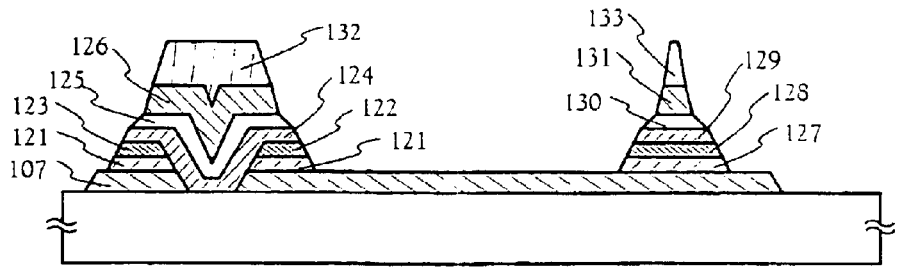

Third etching processing shown in FIG. 3E is conducted for the purpose of defining the shape of a TFT by exposing the surfaces of the data wiring and the pixel electrode. This etching is conducted by dry etching such as the above-mentioned reactive ion etching or ICP etching. $CF_4$ and $Cl_2$ are introduced as etching gas at first, W that forms the third conductive film 115 is etched, and the insulating film 120 is simultaneously etched while allowing an end portion of the third conductive film 115 to roll backward. When the surface of the second semiconductor film 113 is exposed, etching gas is changed to mixed gas of $CF_4$ and $O_2$. When the second semiconductor film 113 and the first semiconductor film 112 are etched, the blocking layer 111 made of Ti is etched, using only $CF_4$ as etching gas. The first conductive film 110 is made of a material containing Al as its main constituent, and this is hardly etched with $CF_4$ so that selective processing can easily be conducted.

Thus, the shape shown in FIG. 3E is formed. On the substrate 101, the data wiring 107 and the pixel electrode 110 made of the first conductive film 102, barrier metal 121 made of the second conductive film 103, source or drain regions 122, 123 made of the n-type first semiconductor film 104, a semiconductor film 124 for forming a channel made of the second semiconductor film 103, a gate insulating film 125 made of an insulating film, and a gate electrode 126 made of the third conductive film 115 are formed. Furthermore, on the pixel electrode 110, a region is provided in which barrier metal 127, a first semiconductor film 128, a second semiconductor film 129, an insulating film 130, and a capacitor wiring 131 are laminated.

Figure 2:
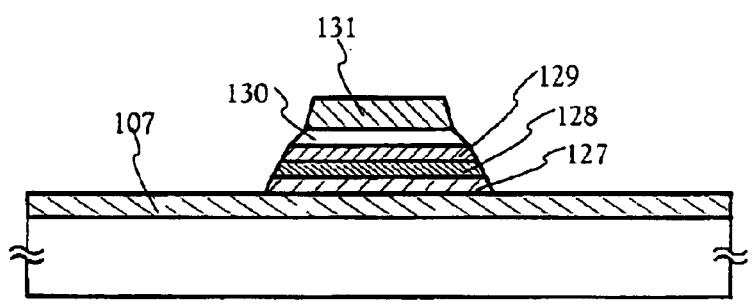
FIG. 2 A cross-sectional view illustrating a structure of a crossing portion between a gate wiring and a data wiring according to the present invention.
Figure 4B:
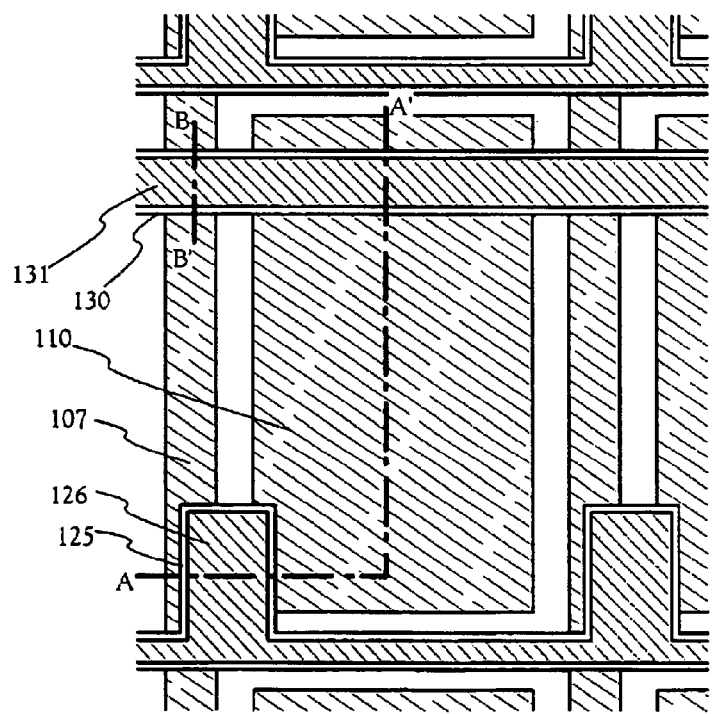

The masks of a resist formed during the step shown in FIG. 3D are also etched to be reduced in size as represented by 132 and 133. When the resist is removed, a pixel TFT 201 and a storage capacitor 202 can be completed as illustrated in FIG. 1. FIG. 4B is a top view of this state, and a line A–A' in this figure corresponds to a cross-sectional view shown in FIG. 1. Furthermore, FIG. 2 is a cross-sectional view taken along a line B–B'. At each crossing portion between the gate wiring 130 and the data wiring 107, the second conductive film 126, the first semiconductor film 128, the second semiconductor film 129, and the insulating film 130 are formed to prevent the gate wiring 130 and the data wiring 107 from contacting with each other to cause a short circuit.

As described above, a TFT can be manufactured by conducting etching processing three times, using two photomasks, and the pixel TFT and the storage capacitor of the liquid crystal display device can be formed as described in FIGS. 1 to 4B. In this embodiment, the pixel electrode is made of Al, so that a reflection type liquid crystal display device can be obtained. Thus, by conducting a light exposure process using a small amount of light, the number of steps of manufacturing a TFT can be substantially reduced and simplified. As a result, the possibility of occurrence of defects caused by adhesion of foreign matter, contamination, and the like during the steps can be decreased.

Embodiment 2

If a transparent conductive material such as indium oxide ($In_2O_3$) or an indium oxide-tin oxide alloy ($In_2O_3$—$SnO_2$, abbreviated as ITO) is used for the first conductive film in Embodiment 1, a transmission type liquid crystal display device can be manufactured. This is formed by using a sputtering method, a vacuum evaporation method, or the like. Etching processing of such a material is conducted by dry etching, using hydrogen iodide (HI) or hydrogen bromide (BrH). However, in particular, etching of ITO is likely to generate a residue. Therefore, in order to improve the processing property of etching, an indium oxide-zinc oxide alloy ($In_2O_3$—ZnO) may be used. An indium oxide-zinc oxide alloy has excellent surface smoothness, and thermal stability superior to that of ITO, and therefore, even when the terminal 104 is made of an Al film, a corrosion reaction can be prevented. Similarly, zinc oxide (ZnO) is also a suitable material. In order to further enhance the transmittance and conductivity of visible light, zinc oxide with gallium (Ga) added thereto (ZnO:Ga) and the like can be used.

Embodiment 3

Figure 5:
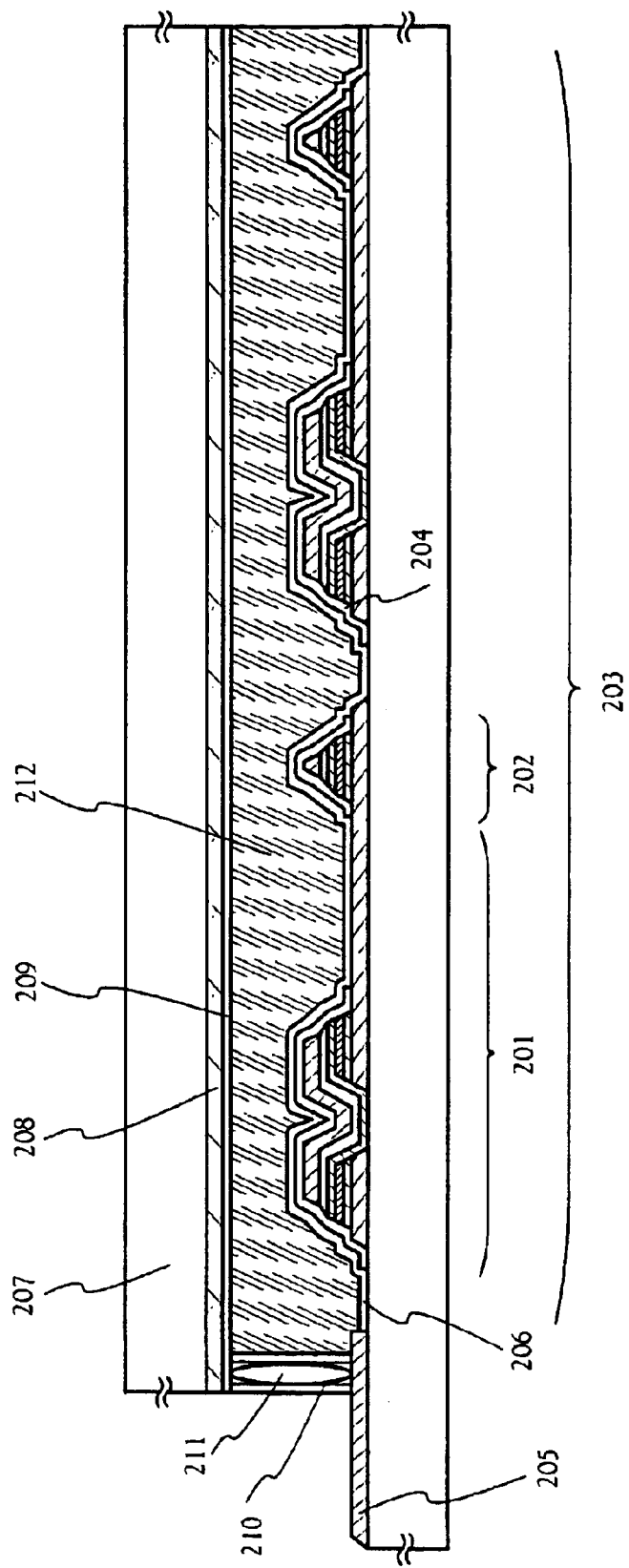
FIG. 5 A cross-sectional view illustrating a structure of a liquid crystal display device of Embodiment 3.

In this embodiment, a manufacturing process of an active matrix liquid crystal display device using the TFT substrate produced in Embodiment 1 will be described. As shown in FIG. 5, an orientation film 206 is formed on the TFT substrate in the state shown in FIG. 1. As an orientation film of a general liquid crystal display device, polyimide resin is mostly used. Furthermore, in FIG. 5, on the pixel TFT 201 and the storage capacitor 202 formed in a pixel portion 203, a passivation film 204 is formed using a silicon nitride film. Although the protective film 204 is important for enhancing the reliability of a TFT, it is not necessarily provided and should be appropriately provided if required.

On an opposing substrate 207 on the opposing side, a transparent conductive film 208 and an orientation film 209 are formed. Furthermore, although not shown, a light shielding film or a color filter may be formed so as to correspond to the arrangement of pixel TFTs. After forming an orientation film, rubbing processing is conducted so that liquid crystal molecules are aligned at a constant pretilt angle.

Figure 6A:
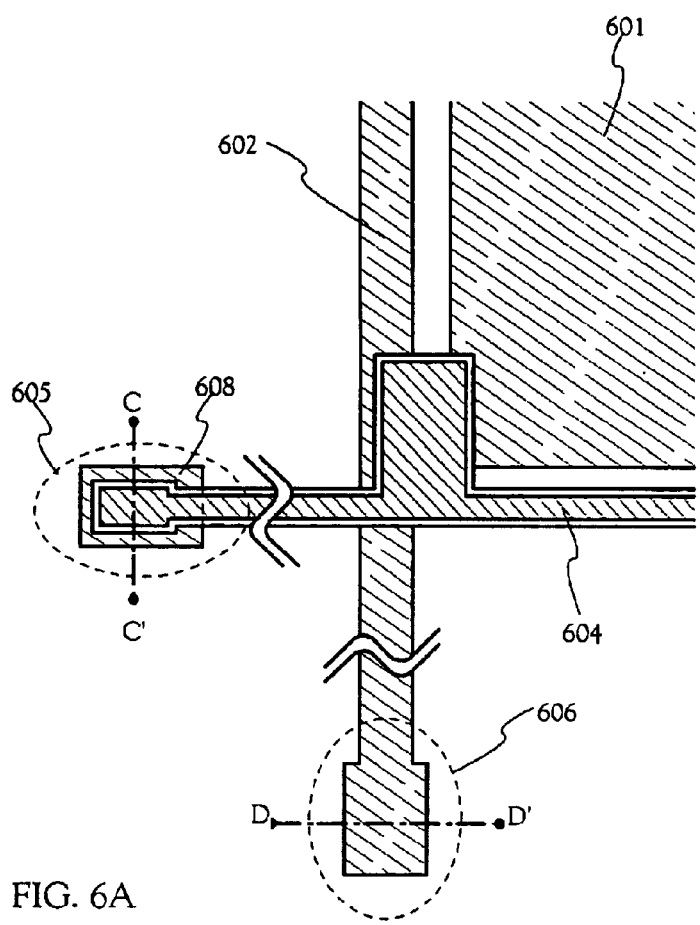
FIGS. 6A–6C A top view and cross-sectional views of an input terminal portion of Embodiment 3.

Then, the TFT substrate and the opposing substrate are attached to each other with a sealant 210 containing a spacer 211 by a known cell assembly step. A spacer (not shown) is dispersed between the substrates so as to keep a constant distance therebetween. As a liquid crystal material 212 injected into the gap, a known material should be applied. Typically, TN liquid crystal is used. After the liquid crystal material is injected, an injection port is sealed with a resin material. A terminal portion 205 is formed outside the opposing substrate 207. The detail of this portion is shown in FIG. 6. FIG. 6A is a top view showing a gate wiring terminal 605 and a data wiring terminal 606 in this state, respectively. These are formed at end portions of a gate wiring 604 and a data wiring 602. Reference numeral 601 indicates a pixel electrode.

Figure 6B:
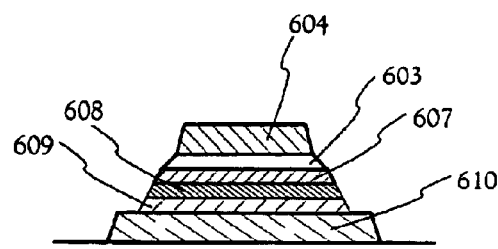
Figure 6C:

FIG. 6B is a cross-sectional view taken along a line C–C' in FIG. 6A. The gate wiring terminal 605 is formed of a lamination including a third conductive film 604, an insulating film 603, a second semiconductor film 607, a first semiconductor film 608, a second conductive film 609, and a first conductive film 610. The first conductive film 608 is patterned with the first photomask described in Embodiment 1 to enhance adhesion between the terminal portion and the substrate. Furthermore, FIG. 6C is a cross-sectional view taken along a line D–D' in FIG. 6A. The data wiring terminal 606 is formed of a first conductive film.

Figure 7A:
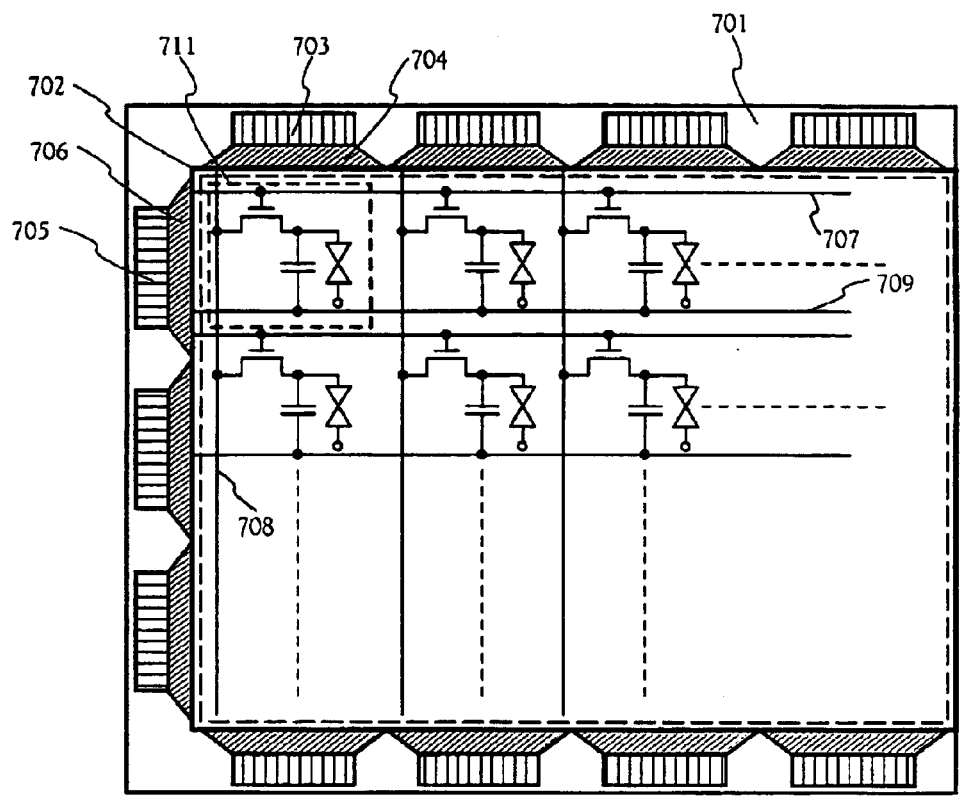
FIGS. 7A–7B Top views illustrating the arrangement of a pixel portion and the input terminal portion of a liquid crystal display device of Embodiment 3.
Figure 7B:
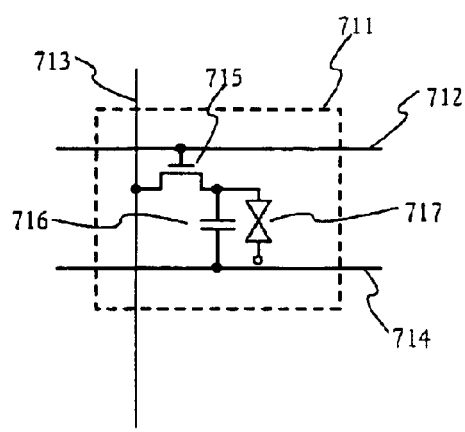

FIGS. 7A and 7B are top views illustrating the arrangement of a pixel portion and an input terminal portion of the above-mentioned active matrix liquid crystal display device. In FIG. 7A, a pixel portion 702 on a substrate 701 is composed of a gate wiring 707, a source wiring 708, and a capacitor wiring 709 crossing each other. A plurality of wirings may be provided in accordance with a pixel density. In the case where the pixel density is of an XGA class, 768 gate wirings, and 1024 data wirings are formed. In the case where the pixel density is a UXGA class, 1200 gate wirings and 1600 data wirings are required. At the outside of the pixel portion 702, an input terminal portion 705 for inputting a signal (scanning signal) to a gate wiring, a connecting portion 706 for connecting the terminal portion to a gate wiring, an input terminal portion 703 for inputting a signal (image signal) to a data wiring, and a connecting portion 704 for connecting the input terminal portion to a data wiring are formed. A driver circuit for conducting an image display is formed of an LSI chip, and mounted by a TAB (tape automated bonding) method or a COG (chip on glass) method.

FIG. 7B shows an equivalent circuit of a pixel 711, and a pixel TFT 715 is formed at a crossing portion between a gate wiring 712 and a data wiring 713. One end of a storage capacitor 716 is connected to a capacitor wiring 714, and the other end thereof is connected to a pixel TFT. The structure of the pixel 711 is shown in a cross-sectional view in FIG. 1 and a top view in FIG. 4B. Furthermore, reference numeral 717 indicates a liquid crystal display portion composed of a pixel electrode, a liquid crystal layer, and an opposing electrode.

Such an active matrix liquid crystal display device can be manufactured in accordance with Embodiment 1 or 2, and can also be utilized in a TV system up to a 30-inch class, as well as a personal computer and a mobile phone.

Embodiment 4

Figure 8:
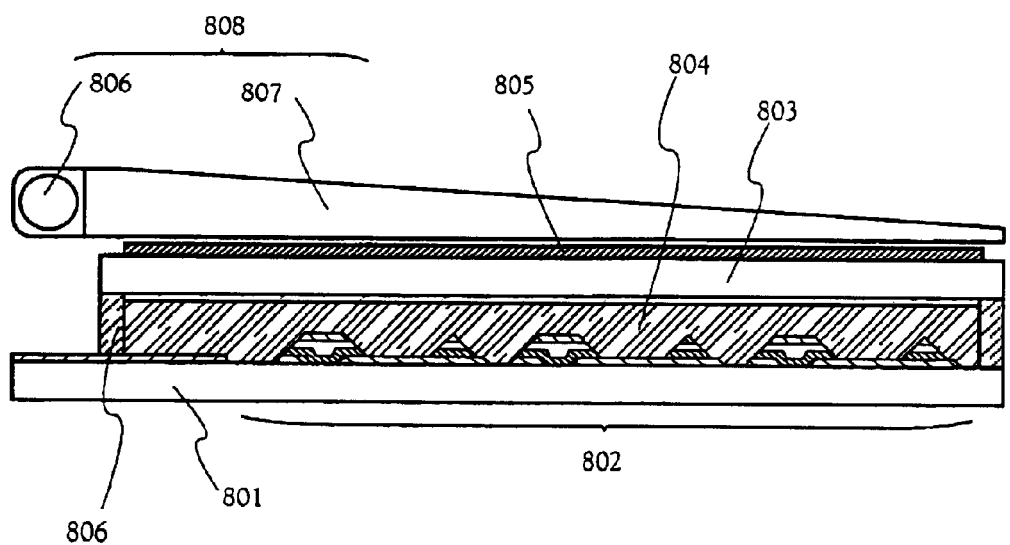
FIG. 8 A view illustrating a structure of a reflection type liquid crystal display device using a front light of Embodiment 4.

FIG. 8 shows an example of a reflection type active matrix liquid crystal display device, in which a pixel portion 802 is formed on a TFT substrate 801 in accordance with Embodiment 1, the TFT substrate 801 is attached to an opposing substrate 803 with a sealant 806, and a liquid crystal layer 804 is provided between the substrates.

The structure shown in FIG. 8 is an example of a reflection type liquid crystal display device using a front light, in which a front light 808 is provided on a polarizing plate 805. The front light is composed of a light source 806 of an LED or a cold cathode tube, a light introducing plate 807 and the like. Such a reflection type liquid crystal display device conducts an image display by utilizing outside light at a bright place during the daytime. However, in the case where sufficient outside light cannot be introduced at night or the like, a method of conducting a display using a front light can be adopted. Such a reflection type liquid crystal display device can be preferably utilized for portable information communication equipment such as a mobile phone and a mobile computer.

Embodiment 5

In this embodiment, a semiconductor device incorporating a display device of the present invention is shown. Embodiments of such a semiconductor device include a portable information terminal (electronic organizer, mobile computer, mobile phone, etc.), a video camera, a still camera, a personal computer, a TV, and the like. FIGS. 9A–9E and FIGS. 10A–10C show the examples.

Figure 9A:
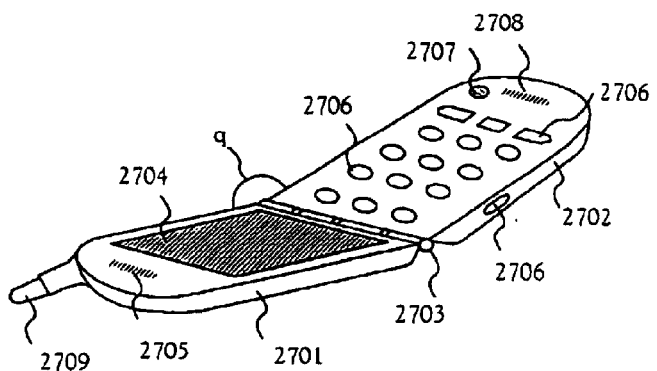
FIGS. 9A–9E Views illustrating examples of semiconductor devices of Embodiment 5.

FIG. 9A shows a mobile phone composed of a display panel 2701, an operation panel 2702, and a connecting portion 2703. The display panel 2701 is provided with a display 2704 with an image sensor built therein, a sound output portion 2705, an antenna 2709, and the like. The operation panel 2702 is provided with operation keys 2706, a power switch 2707, a sound input portion 2708, and the like. The present invention is applicable to the display 2704 with an image sensor built therein. In particular, according to the present invention, low power consumption can be realized with the reflection type liquid crystal display device in Embodiment 4 by allowing a front light to light up only when required or programming a front light so that it is automatically turned off after lighting up for a predetermined period of time.

Figure 9B:
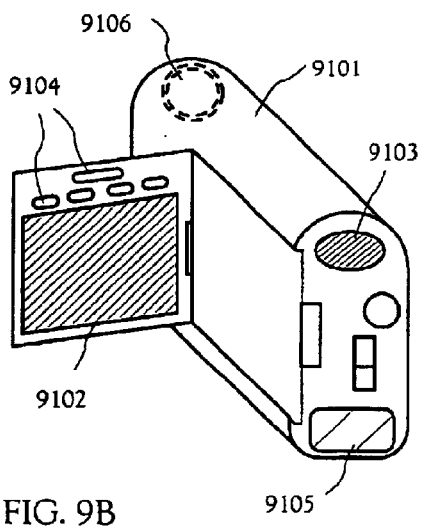

FIG. 9B shows a video camera that is composed of a main body 9101, a display device 9102, a sound input portion 9103, operation switches 9104, a battery 9105, and an image-receiving portion 9106. The present invention is applicable to the display device 9102. In particular, the reflection type liquid crystal display device shown in Embodiment 4 is suitable in terms of low power consumption.

Figure 9C:
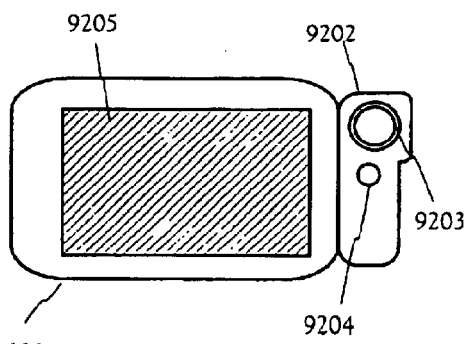

FIG. 9C shows a mobile computer or a portable information terminal that is composed of a main body 9201, a camera portion 9202, an image-receiving portion 9203, an operation switch 9204, and a display device 9205. The present invention is applicable to the display device 9205. In particular, the reflection type liquid crystal display device shown in Embodiment 4 is suitable in terms of low power consumption.

Figure 9D:
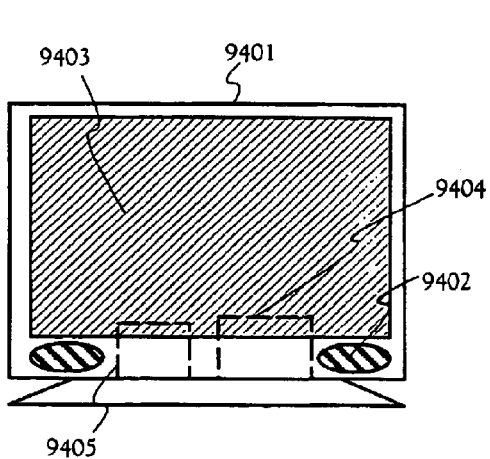

FIG. 9D shows a TV receiver that is composed of a main body 9401, speakers 9402, a display device 9403, a receiving device 9404, an amplifier 9405, and the like. The present invention is applicable to the display device 9403. In particular, the reflection type liquid crystal display device shown in Embodiment 4 is suitable in terms of low power consumption.

Figure 9E:
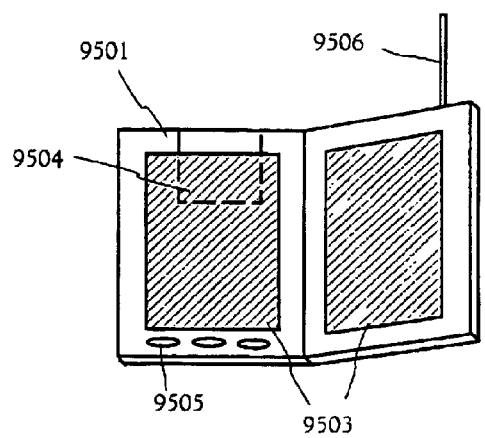

FIG. 9E shows a portable book that is composed of a main body 9501, a display device 9503, a memory medium 9504, operation switches 9505, and an antenna 9506 and displays data stored in a mini disk (MD) or a DVD, and data received through the antenna. As the direct-view-type display device 9503, in particular, the reflection type liquid crystal display device shown in Embodiment 4 is suitable in terms of low power consumption.

Figure 10A:
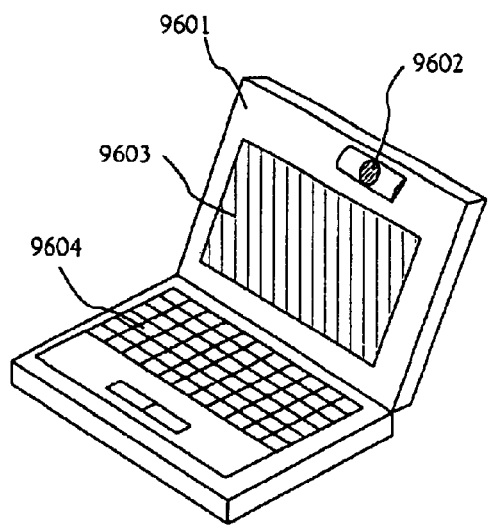
FIGS. 10A–10C Views illustrating examples of semiconductor devices of Embodiment 5.

FIG. 10A shows a personal computer that is composed of a main body 9601, an image input portion 9602, a display device 9603, and a keyboard 9604. The present invention is applicable to the display device 9603. In particular, the reflection type liquid crystal display device shown in Embodiment 4 is suitable in terms of low power consumption.

Figure 10B:
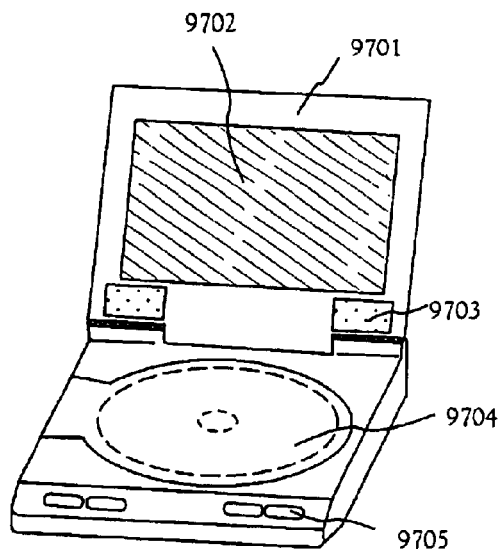

FIG. 10B shows a player using a recording medium storing a program therein (hereinafter, referred to as a recording medium) that is composed of a main body 9701, a display device 9702, speaker portions 9703, a recording medium 9704, and operation switches 9705. This device uses a DVD (digital versatile disk), a CD, or the like as a recording medium to allow a user to listen to music, see movies, play games, and use the Internet. The present invention is applicable to the display device 9702. In particular, the reflection type liquid crystal display device shown in Embodiment 4 is suitable in terms of low power consumption.

Figure 10C:
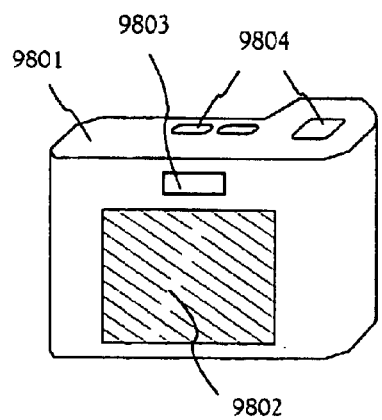

FIG. 10C shows a digital camera that is composed of a main body 9801, a display device 9802, an eyepiece 9803, operation switches 9804, and an image-receiving portion (not shown). The present invention is applicable to the display device 9802. In particular the reflection type liquid crystal display device shown in Embodiment 4 is suitable in terms of low power consumption.

Although not shown herein, the present invention is further applicable to a display device to be incorporated into a refrigerator, a washing machine, a microwave oven, a fixed telephone, and the like as well as a navigation system. Thus, the application range of the present invention is very wide, and the present invention is applicable to various products.

By using the present invention, a TFT can be manufactured by conducting etching processing three times, using two photomasks. Consequently, the reduction of a manufacturing cost and the enhancement of yield can be realized by reducing the number of steps of a TFT. Accordingly, the active matrix liquid crystal display device can be manufactured by using the TFT.

What is claimed is:

1. A semiconductor device comprising:
   a first wiring and a second wiring formed of a first conductive film on an insulating surface;

a second conductive film formed on the first and second wirings so as to correspond thereto;
a pair of first semiconductor films of one conductivity type formed on the second conductive film;
a second semiconductor film formed on and extending between the pair of first semiconductor films;
an insulating film formed on the second semiconductor film;
a third conductive film formed on the insulating film; and
a storage capacitor comprising:
   a first layer comprising a same material as the first conductive film and the second wiring on the insulating surface;
   a second layer comprising a same material as the second conductive film on the first layer;
   a third layer comprising a same material as the pair of first semiconductor films of one conductivity type on the second layer;
   a fourth layer comprising a same material as the second semiconductor film on the second layer;
   a fifth layer comprising a same material as the insulating film on the fourth layer; and
   a sixth layer comprising a same material as the third conductive film on the fifth layer;
wherein an end portion of the second semiconductor film is provided inside an end portion of the second conductive film, and
wherein each of the first wiring and the second wiring has tapered inner and outer edges.

2. A semiconductor device according to claim 1, wherein each of the first wiring and the second wiring comprises aluminum.

3. A semiconductor device according to claim 1, wherein each of the first wiring and the second wiring comprises a conductive oxide film.

4. A semiconductor device according to claim 1, wherein the third conductive film comprises at least one material selected from the group consisting of Ta, Ti, W and an alloy thereof.

5. A semiconductor device according to claim 1, wherein the semiconductor device is one selected from the group consisting of a mobile phone, a video camera, a portable information terminal, a liquid crystal TV receiver, a portable book, a personal computer, a DVD player, and a digital still camera.

6. A semiconductor device comprising:
a data wiring and a pixel electrode formed on an insulating surface;
barrier metal formed so as to correspond to the data wiring and the pixel electrode;
a pair of first semiconductor films of one conductivity type formed on the barrier metal;
a second semiconductor film formed on and extending between the pair of first semiconductor films;
a gate insulating film formed on the gate insulating film;
a gate electrode formed on the gate insulating film; and
a storage capacitor comprising:
   a first layer comprising a same material as the pixel electrode on the insulating surface;
   a second layer comprising a same material as the barrier metal on the first layer;
   a third layer comprising a same material as the pair of first semiconductor films of one conductivity type on the second layer;
   a fourth layer comprising a same material as the second semiconductor film on the second layer;
   a fifth layer comprising a same material as the gate insulating film on the fourth layer; and
   a sixth layer comprising a same material as the date electrode on the fifth layer;
wherein an end portion of the second semiconductor film is provided inside an end portion of the barrier metal, and
wherein each of the data wiring and the pixel electrode has tapered inner and outer edges.

7. A semiconductor device according to claim 6, wherein each of the data wiring and the pixel electrode comprises aluminum.

8. A semiconductor device according to claim 6, wherein each of the data wiring and the pixel electrode comprises a conductive oxide film.

9. A semiconductor device according to claim 6, wherein the gate electrode comprises at least one material selected from the group consisting of Ta, Ti, W, and an alloy thereof.

10. A semiconductor device according to claim 6, wherein the semiconductor device is one selected from the group consisting of a mobile phone, a video camera, a portable information terminal, a liquid crystal TV receiver, a portable book, a personal computer, a DVD player, and a digital still camera.

11. A semiconductor device comprising:
at least first and second conductive films formed on an insulating surface wherein the first and second conductive films are separated from each other;
a pair of first semiconductor films of one conductivity type formed over the first and second conductive films;
a second semiconductor film formed on and extending between the pair of first semiconductor films;
an insulating film including a gate insulating film formed on the second semiconductor film;
a third conductive film including a gate electrode formed on the insulating film; and
a storage capacitor comprising:
   a first layer comprising a same material as the at least first and second conductive films on the insulating surface;
   a second layer comprising a same material as the pair of first semiconductor films over the first layer;
   a third layer comprising a same material as the second semiconductor film on the second layer;
   a fourth layer comprising a same material as the insulating film on the third insulating layer; and
   a fifth layer comprising a same material as the third conductive film on the fourth layer,
wherein each of the first and second conductive films and the pair of first semiconductor films has tapered inner and outer edges.

12. The semiconductor device according to claim 11 wherein the edge of the pair of first semiconductor films has a tapered angle of 5–45°.

13. The semiconductor device according to claim 11 further comprising a barrier metal layer interposed between the first and second conductive films and the pair of first semiconductor films, respectively, wherein said barrier metal layer comprises a material selected from the group consisting of Ti, Ta, TiN and TaN.

14. The semiconductor device according to claim 11 wherein said third conductive film has a tapered outer edge.

15. A semiconductor device comprising:
at least first and second conductive films formed on an insulating surface wherein the first and second conductive films are separated from each other;

a pair of first semiconductor films of one conductivity type formed over the first and second conductive films;

a second semiconductor film formed on and extending between the pair of first semiconductor films;

an insulating film including a gate insulating film formed on the second semiconductor film;

a third conductive film including a gate electrode formed on the insulating film; and a storage capacitor comprising:
  a first layer comprising a same material as one of the at least first and second conductive films on the insulating surface;
  a second layer comprising a same material as the pair of first semiconductor films over the first layer;
  a third layer comprising a same material as the second semiconductor film on the second layer; and
  a fourth layer comprising a same material as the third conductive film,
wherein each of the pair of first semiconductor films and the second semiconductor film has tapered inner and outer edges and the pair of first semiconductor films extend beyond side edges of the second semiconductor film.

16. The semiconductor device according to claim 15 wherein the edge of the pair of first semiconductor films has a tapered angle of 5–45°.

17. The semiconductor device according to claim 15 further comprising a barrier metal layer interposed between the first and second conductive films and the pair of first semiconductor films, respectively, wherein said barrier metal layer comprises a material selected from the group consisting of Ti, Ta, TiN and TaN.

18. A semiconductor device comprising:

at least first and second conductive films formed on an insulating surface wherein the first and second conductive films are separated from each other;

a pair of first semiconductor films of one conductivity type formed over the first and second conductive films;

a second semiconductor film formed on and extending between the pair of first semiconductor films;

an insulating film including a gate insulating film formed on the second semiconductor film;

a third conductive film including a gate electrode formed on the insulating film; and a storage capacitor comprising:
  a first layer comprising a same material as one of the at least first and second conductive films on the insulating surface;
  a second layer comprising a same material as the pair of first semiconductor films over the first layer;
  a third layer comprising a same material as the second semiconductor film on the second layer;
  a fourth layer comprising a same material as the insulating film on the third layer; and
  a fifth layer comprising a same material as the third conductive film on the fourth layer,
wherein each of the second semiconductor film and the third conductive film has tapered inner and outer edges and the second semiconductor film extends beyond side edges of the third conductive film.

19. The semiconductor device according to claim 18 wherein the edge of the third conductive film has a tapered angle of 15–45°.

20. The semiconductor device according to claim 18 further comprising a barrier metal layer interposed between the first and second conductive films and the pair of first semiconductor films, respectively, wherein said barrier metal layer comprises a material selected from the group consisting of Ti, Ta, TiN and TaN.

21. A semiconductor device comprising:

at least first and second conductive films formed on an insulating surface wherein the first and second conductive films are separated from each other;

a pair of barrier metal layers formed on the first and second conductive films wherein said barrier metal layers have a tapered outer edge;

a pair of first semiconductor films of one conductivity type formed on the pair of barrier metal layers, respectively, wherein each of the pair of first semiconductor films has a tapered outer edge;

a second semiconductor film formed on and extending between the pair of first semiconductor films wherein the second semiconductor film has a tapered outer edge;

an insulating film including a gate insulating film formed on the second semiconductor film;

a third conductive film including a gate electrode formed on the insulating film wherein said third conductive film has a tapered outer edge; and a storage capacitor comprising:
  a first layer comprising a same material as one of the at least first and second conductive films on the insulating surface;
  a second layer comprising a same material as the pair of barrier metal layers on the first layer;
  a third layer comprising a same material as the pair of first semiconductor films on the second layer;
  a fourth layer comprising a same material as the second semiconductor film on the third layer;
  a fifth layer comprising a same material as the insulating film on the fourth layer; and
  a sixth layer comprising a same material as the third conductive film on the fifth layer,
wherein said insulating film extends beyond the outer edge of the third conductive film, and said second semiconductor film extends beyond the outer edge of the insulating film,
wherein each of the first conductive film and the second conductive film has tapered inner and outer edges.

22. The semiconductor device according to claim 21 wherein the edge of the third conductive film has a tapered angle of 15–45°.

23. The semiconductor device according to claim 21, wherein said pair of barrier metal layers comprises a material selected from the group consisting of Ti, Ta, TiN and TaN.

* * * * *